United States Patent [19]
Landry

[11] Patent Number: 5,391,941
[45] Date of Patent: Feb. 21, 1995

[54] DECODER CIRCUITRY WITH BALANCED PROPAGATION DELAY AND MINIMIZED INPUT CAPACITANCE

[75] Inventor: Gregory J. Landry, Santa Clara, Calif.

[73] Assignee: Cypress Semiconductor Corporation, San Jose, Calif.

[21] Appl. No.: 126,069

[22] Filed: Sep. 23, 1993

[51] Int. Cl.⁶ .............................................. H03K 19/20
[52] U.S. Cl. ....................................... 326/106; 326/21; 326/105
[58] Field of Search ............... 307/449, 463, 451, 443; 365/230.06

[56] References Cited

U.S. PATENT DOCUMENTS

| | | | |
|---|---|---|---|
| 4,433,257 | 2/1984 | Kinoshita | 307/449 |
| 4,644,189 | 2/1987 | Gabillard | 307/449 |
| 5,059,825 | 10/1991 | Yoshida | 307/449 |
| 5,157,283 | 10/1992 | Kin | 307/449 |
| 5,214,606 | 5/1993 | Hashimoto | 365/230.06 |

Primary Examiner—Edward P. Westin
Assistant Examiner—Andrew Sanders
Attorney, Agent, or Firm—Blakely, Sokoloff, Taylor & Zafman

[57] ABSTRACT

A logic circuit implementing a logic NAND function with respect to a first input signal and a second input signal is described. First and second P-channel transistors are coupled in parallel to a power supply and an output node. Each of the first and second P-channel transistors receives the respective one of the first and second input signals. A first circuit branch has a first and a second N-channel transistor. The first N-channel transistor has a first end coupled to the output node and a second end coupled to a first end of the second N-channel transistor. The second N-channel transistor has a second end coupled to ground. The first N-channel transistor receives the first input signal and the second N-channel transistor receives the second input signal. A second circuit branch has a third and a fourth N-channel transistor. The third N-channel transistor has a first end coupled to the output node and a second end coupled to a first end of the fourth N-channel transistor. The fourth N-channel transistor has a second end coupled to ground. The third N-channel transistor receives the second input signal and the fourth N-channel transistor receives the first input signal such that the logic circuit has a balanced propagation delay with respect to the first and second input signals. The logic circuit can be used to form a decoder circuit that has a balanced propagation delay for the input signals and a minimized input capacitance. The above described logic circuit can also be changed accordingly to implement a logic NOR function.

22 Claims, 11 Drawing Sheets

DECODER CIRCUITRY WITH BALANCED PROPAGATION DELAY AND MINIMIZED INPUT CAPACITANCE

FIELD OF THE INVENTION

The present invention pertains to the field of integrated circuits. More particularly, this invention relates to an improved decoder circuit with balanced propagation delay and minimized input capacitance.

BACKGROUND OF THE INVENTION

One type of prior NAND gate and NOR gate logic circuits typically employ complementary metal-oxide semiconductor ("CMOS") transistors. The prior NAND gate and NOR gate logic circuits are typically employed for most digital logic designs. One application for one type of prior NAND gate and NOR gate logic circuits is to form decoders or pre-decoders. Typically, NAND gate logic circuits are used to form a decoder circuit when the input signals of the decoder are active high signals. NOR gate logic circuits are used to form a decoder circuit when the input signals of the decoder are active low signals. FIG. 1 schematically illustrates the logic configuration of a prior decoder 10 that is implemented with four NAND gate logic circuits. FIG. 2 schematically illustrates the logic configuration of a prior decoder 20 that includes four NOR gate logic circuits. Each of decoders 10 and 20 of FIGS. 1 and 2, respectively, receives a binary sequence of input signals. FIGS. 1-2 each illustrates one typical implementation of a decoder using CMOS transistors. The circuit of decoder 10 of FIG. 1 is shown in FIG. 3 and the circuit of decoder 20 of FIG. 2 is shown in FIG. 4.

Referring to FIG. 3, transistors 31 through 34 form NAND gate 14 of FIG. 1. Transistors 35 through 38 form NAND gate 13 of FIG. 1. Transistors 39 through 42 form NAND gate 12 of FIG. 1 and transistors 43 through 46 form NAND gate 11 of FIG. 1. Transistors 31–32, 35–36, 39–40, and 43–44 are P-channel transistors and are connected in parallel, respectively. Transistors 33–34, 37–38, 41–42, and 45–46 are N-channel transistors and are connected in series, respectively.

Referring to FIG. 4, transistors 51 through 54 form NOR gate 21 of FIG. 2. Transistors 55 through 58 form NOR gate 22 of FIG. 2. Transistors 59 through 62 form NOR gate 23 of FIG. 2 and transistors 63–66 form NOR gate 24 of FIG. 2. Transistors 53–54, 57–58, 61–62, and 65–66 are N-channel transistors and are connected in parallel, respectively. Transistors 51–52, 55–56, 59–60, and 63–64 are P-channel transistors and are connected in series, respectively.

One disadvantage associated with the above-mentioned prior art circuits of FIGS. 3 and 4 is that the input capacitance in each of the circuits 30 and 50 is relatively high. This is due to the fact that each of the NAND gate or NOR gate circuit is independently configured with transistors in the respective one of decoder circuits 30 and 50, This typically causes some level of redundancy in the decoder circuit because the same input signal is typically applied to different NAND or NOR gate circuits. For example, as shown in FIG. 3, transistors 34 and 38 both receive the same $\overline{B}$ input signal and transistors 42 and 46 both receive the same B input signal. Similarly in FIG. 4, transistors 51 and 55 both receive the same D input signal and transistors 59 and 63 both receive the same $\overline{D}$ input signal.

Another disadvantage associated with the above-mentioned prior art decoder circuits of FIGS. 3 and 4 is that the propagation delay for an input signal through its respective circuit is typically different than that for another input signal through the same circuit. This is typically due to the fact that some of the transistors are serially connected to receive the input signals in both the NAND gate circuit and NOR gate circuit. As can be seen in FIG. 3, transistor 45, for example, is connected between an output node 37a and ground via transistor 46. The gate of transistor 45 receives the A input signal while the gate of transistor 46 receives the B input signal. If output 37a of the NAND gate formed by transistors 43-46 is in transition from logical high to logical low due to the signal change of the B input signal (where the A input signal is already logically high), both output node 37a and the node between transistors 45 and 46 must be discharged through transistors 45 and 46. If, on the other hand, output node 37a is in transition from logical high to logical low due to the signal change of the A input signal (where the B input signal is already logically high), then only output node 37a needs to be discharged. Therefore, the propagation delay for the A input signal is less than that of the B input signal for the NAND gate formed by transistors 43–46.

Similarly, as can be seen from FIG. 4, transistor 51 is connected between the power supply and an output node 55a via transistor 52. The gate of transistor 51 receives the D input signal while the gate of transistor 52 receives the C input signal. If output node 55a of NOR gate formed by transistors 51 through 54 is in transition from logical low to logical high due to the signal change of the D input signal (where the C input signal is already logically low), both output node 55a and the node between transistors 51 and 52 must be charged through transistors 51 and 52. If, on the other hand, output node 55a is in transition from logical low to logical high due to the signal change of the C input signal (where the D input signal is already logically low), only output node 55a needs to be charged through transistors 51-52. Therefore, the circuits in FIGS. 3–4 both suffered from the unbalanced propagation delay between the input signals.

SUMMARY AND OBJECTS OF THE INVENTION

One of the objects of the present invention is to provide a logic circuit with balanced propagation delay for the input signals of the logic circuit.

Another object of the present invention is to provide a decoder circuit with (1) balanced propagation delay for the input signals of the decoder circuit and (2) minimized input capacitance.

A further object of the present invention is to provide a decoder circuit with (1) balanced propagation delay for the input signals of the decoder circuit, (2) minimized input capacitance, and (3) increased load driving ability.

A logic circuit implementing a logic NAND function with respect to a first input signal and a second input signal is described. First and second pull up elements are coupled in parallel to a power supply and an output node. Each of the first and second pull up elements receives the respective one of the first and second input signals. A first circuit branch has a first and a second N-channel transistor. The first N-channel transistor has a first end coupled to the output node and a second end coupled to a first end of the second N-channel transistor. The second N-channel transistor has a second end coupled to ground. The first N-channel transistor receives the first input signal and the second N-channel transistor receives the second input signal. A second circuit branch has a third and a fourth N-channel transistor. The third N-channel transistor has a first end coupled to the output node and a second end coupled to a first end of the fourth N-channel transistor. The fourth N-channel transistor has a second end coupled to ground. The third N-channel transistor receives the second input signal and the fourth N-channel transistor receives the first input signal such that the logic circuit has a balanced propagation delay with respect to the first and second input signals. The above described logic circuit can also be changed accordingly to implement a logic NOR function.

A decoder circuit for a semiconductor circuit comprises an N-channel transistor network circuit and a pull up network circuit. In one embodiment, the pull up network circuit includes a first pair, a second pair, a third pair, and a fourth pair of pull up elements coupled in parallel to a power supply and a respective one of a first, a second, a third, and a fourth output node. The first pair of pull up elements receive a first input signal and a second input signal. The second pair of pull up elements receive (1) a complementary signal of the first input signal and (2) the second input signal. The third pair of pull up elements receive (1) the first input signal and (2) a complementary signal of the second input signal. The fourth pair of pull up elements receive complementary signals of the first and second input signals.

The N-channel transistor network circuit is coupled to the first, second, third, and fourth output nodes and a ground. The N-channel transistor network circuit further comprises a first, a second, a third, and a fourth N-channel transistor circuit branch. The first N-channel transistor circuit branch has a first, a second, and a third N-channel transistor. The first N-channel transistor has a first end coupled to the ground, a second end coupled to a first end of the second and third N-channel transistors. The second N-channel transistor has a second end coupled to the first output node. The third N-channel transistor has a second end coupled to the second output node. The first N-channel transistor receives the second input signal at a control input. The second N-channel transistor receives the first input signal at a control input. The third N-channel transistor receives the complementary signal of the first input signal at a control input.

The second N-channel transistor circuit branch has a fourth, a fifth, and a sixth N-channel transistor. The fourth N-channel transistor has a first end coupled to the ground, a second end coupled to a first end of the fifth and sixth N-channel transistors, wherein the fifth N-channel transistor has a second end coupled to the first output node. The sixth N-channel transistor has a second end coupled to the third output node. The fourth N-channel transistor receives the first input signal at a control input. The fifth N-channel transistor receives the second input signal at a control input. The sixth N-channel transistor receives the complementary signal of the second input signal at a control input.

The third N-channel transistor circuit branch has a seventh, an eighth, and a ninth N-channel transistor. The seventh N-channel transistor has a first end coupled to the ground, a second end coupled to a first end of the eighth and ninth N-channel transistors. The eighth N-channel transistor has a second end coupled to the third output node. The ninth N-channel transistor has a second end coupled to the fourth output node. The seventh N-channel transistor receives the complementary signal of the second input signal at a control input. The eighth N-channel transistor receives the first input signal at a control input. The ninth N-channel transistor receives the complementary signal of the first input signal at a control input.

The fourth N-channel transistor circuit branch has a tenth, an eleventh, and a twelfth N-channel transistor. The tenth N-channel transistor has a first end coupled to the ground, a second end coupled to a first end of the eleventh and twelfth N-channel transistors. The eleventh N-channel transistor has a second end coupled to the second output node. The twelfth N-channel transistor has a second end coupled to the fourth output node. The tenth N-channel transistor receives the complementary signal of the first input signal at a control input. The eleventh N-channel transistor receives the second input signal at a control input. The twelfth N-channel transistor receives the complementary signal of the second input signal at a control input. The decoder circuit has a balanced propagation delay with respect to the first and second input signals and a minimized input capacitance. The above described decoder circuit can also be implemented in a NOR configuration.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
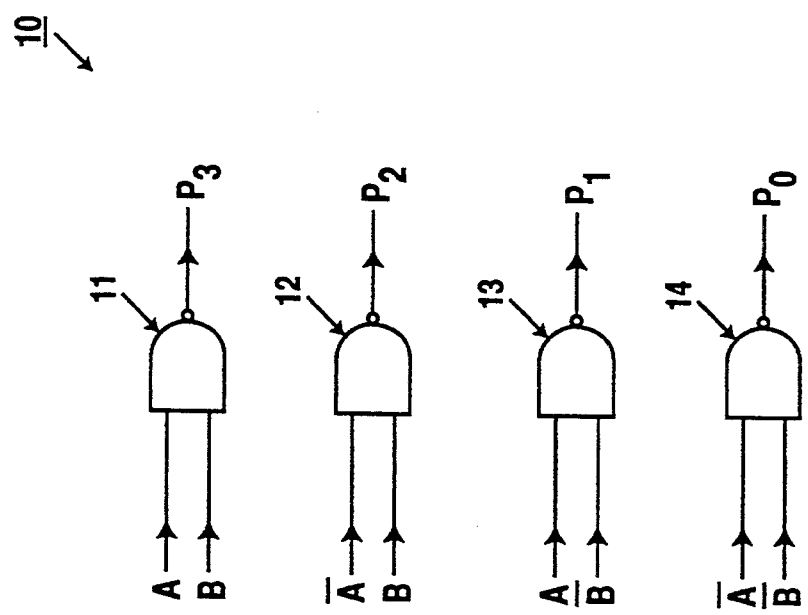
FIG. 1 is a logic diagram of a decoder circuit that is implemented in NAND configuration.
Figure 3:
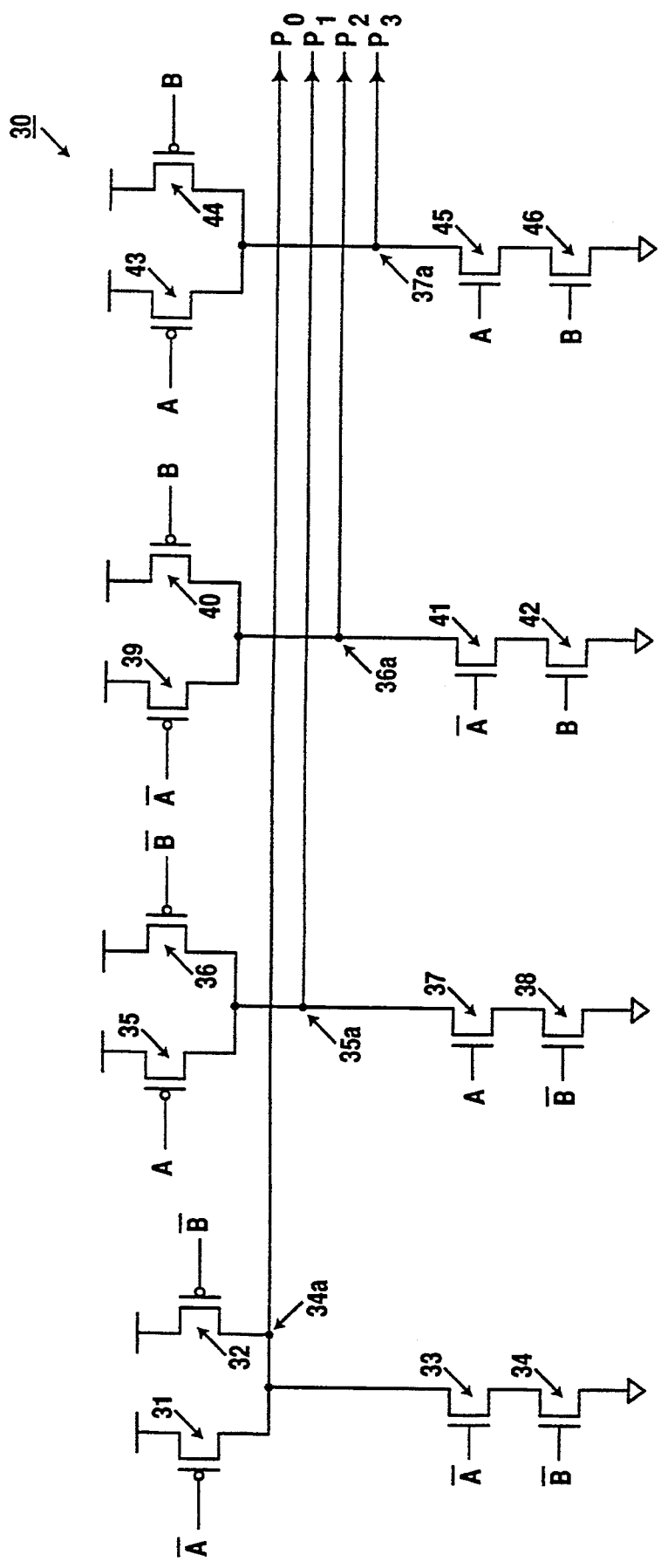
FIG. 3 is a circuit diagram of a prior an circuit that implements the logic function of the decoder circuit of FIG. 1.
Figure 5:
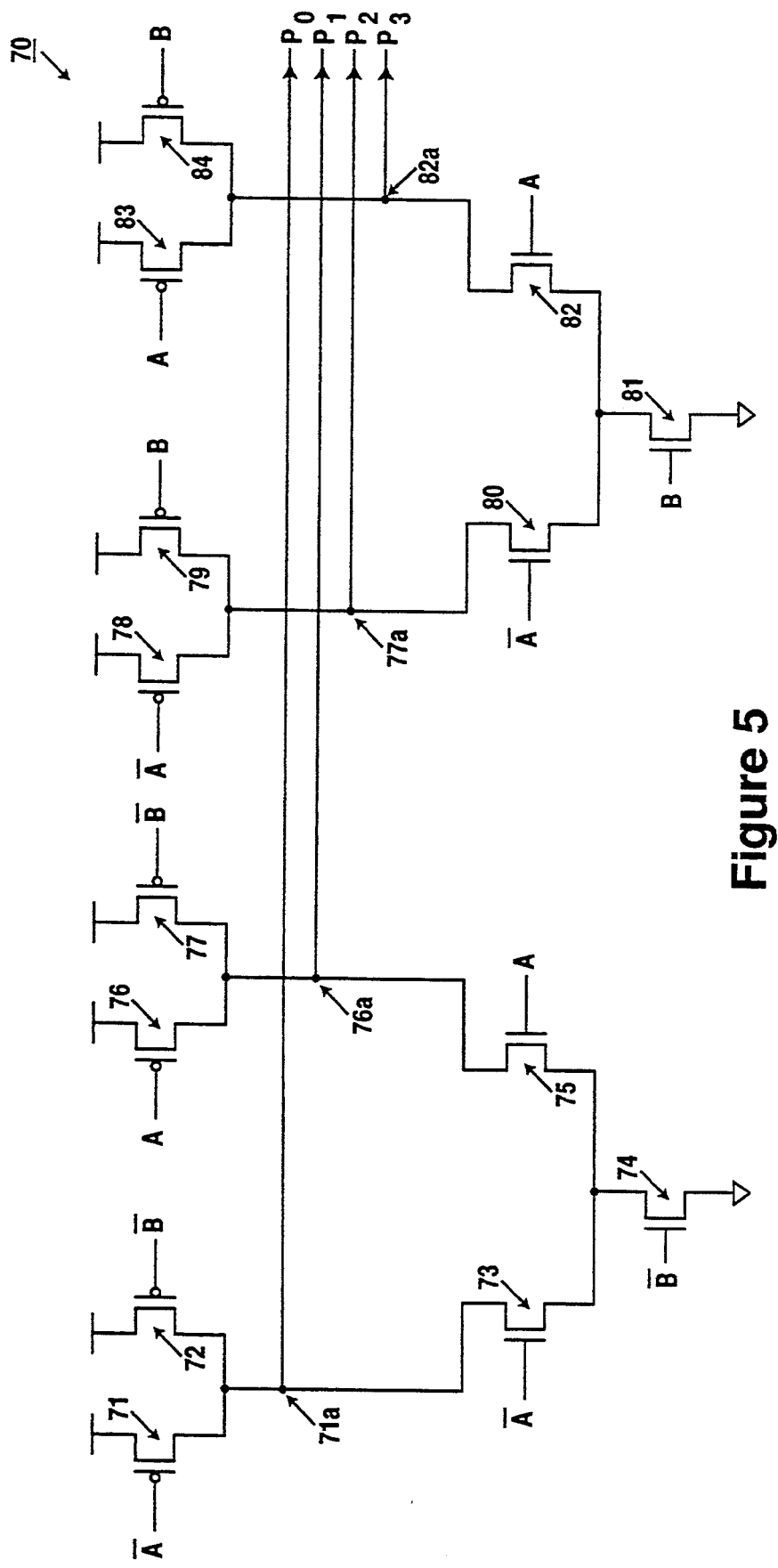
FIG. 5 is a circuit diagram of another prior art circuit that implements the logic function of the decoder circuit of FIG. 1.

FIG. 5 illustrates the circuit of a prior decoder circuit 70 which is a prior improvement of circuit 30 of FIG. 3. Decoder circuit 70 also implements the logic function of decoder 10 of FIG. 1. As can be seen from FIG. 5, transistors 71 through 74 form one NAND gate (i.e., NAND gate 14 of FIG. 1). Transistors 74 through 77 form another NAND gate (i.e., NAND gate 13 of FIG. 1). Transistor 74 is shared by two NAND gate circuits. Transistors 78 through 81 form the third NAND gate (i.e., NAND gate 12 of FIG. 1). Transistors 81 through 84 form the fourth NAND gate (i.e., NAND gate 11 of FIG. 1). Transistor 81 is shared by two NAND gate circuits.

Circuit 70 of FIG. 5 reduces the input capacitance for the B input signal. This is done by reducing the number of transistors for each NAND gate circuit. As is shown in FIG. 5, transistor 74 is shared by two NAND gate circuits and transistor 81 is shared by two NAND gate circuits. This is made possible due to the fact that the $\overline{A}$ input signal is the complementary signal of the A input signal and the $\overline{A}$ and A input signals cannot be both logically high or low at the same time.

Although circuit 70 of FIG. 5 reduces the input capacitance for the B input signal, the circuit still suffers from different propagation delays between the A input signal and the B input signal. In addition, the input capacitance for the A input signal is not reduced.

Figure 2:
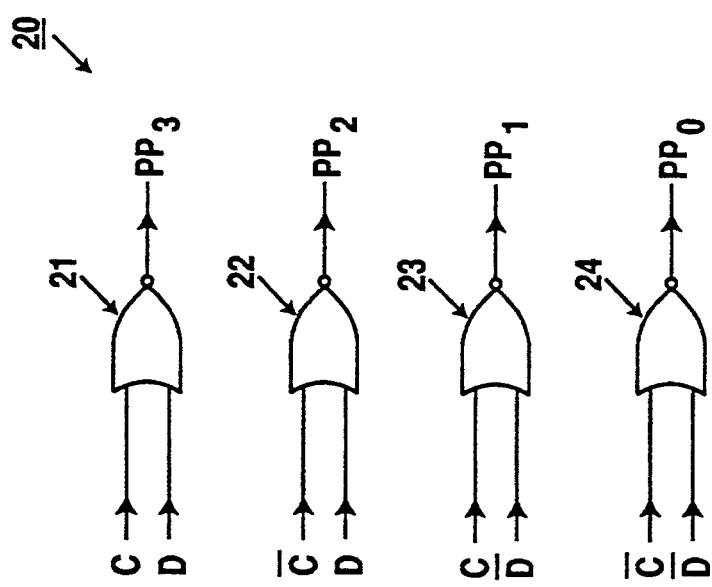
FIG. 2 is a logic diagram of another decoder circuit that is implemented in NOR configuration.
Figure 4:
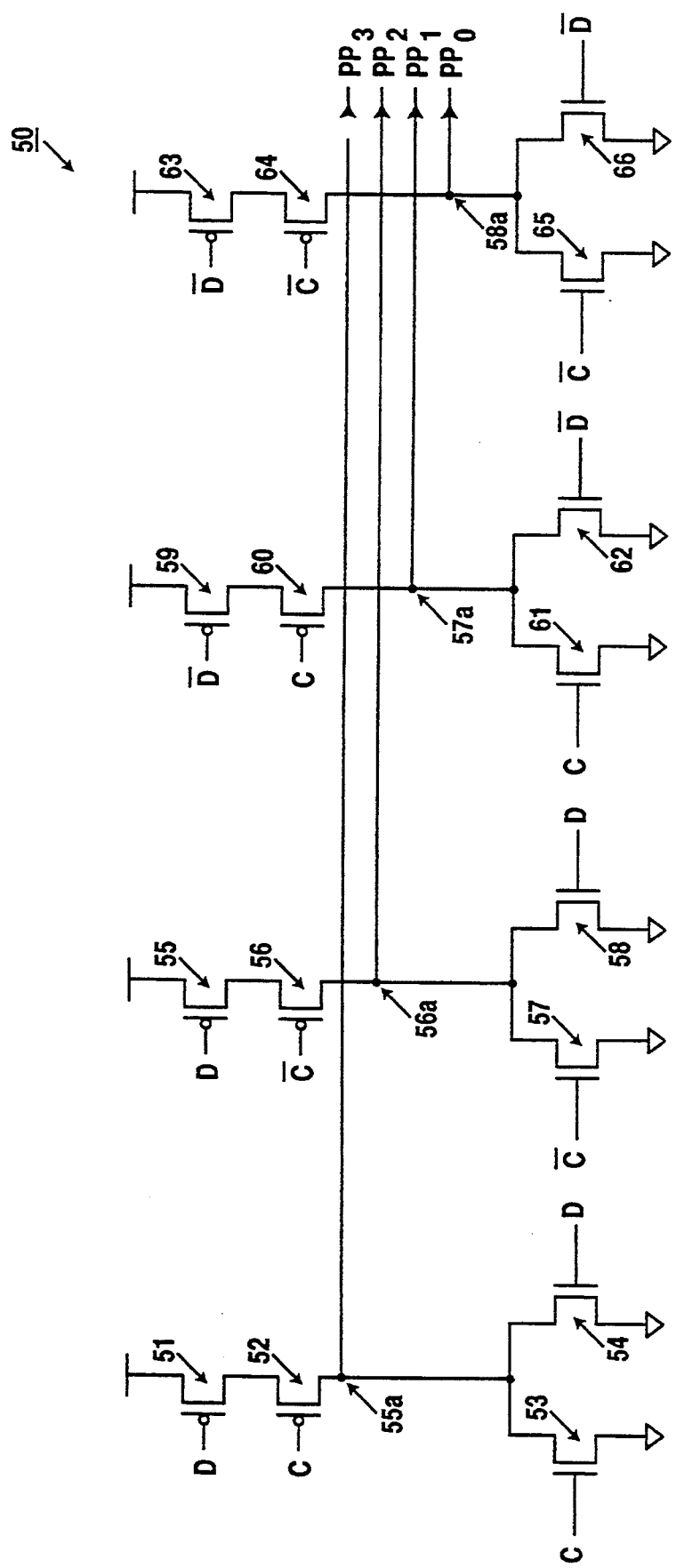
FIG. 4 is a circuit diagram of a prior an circuit that implements the logic function of the decoder circuit of FIG. 2.
Figure 6:
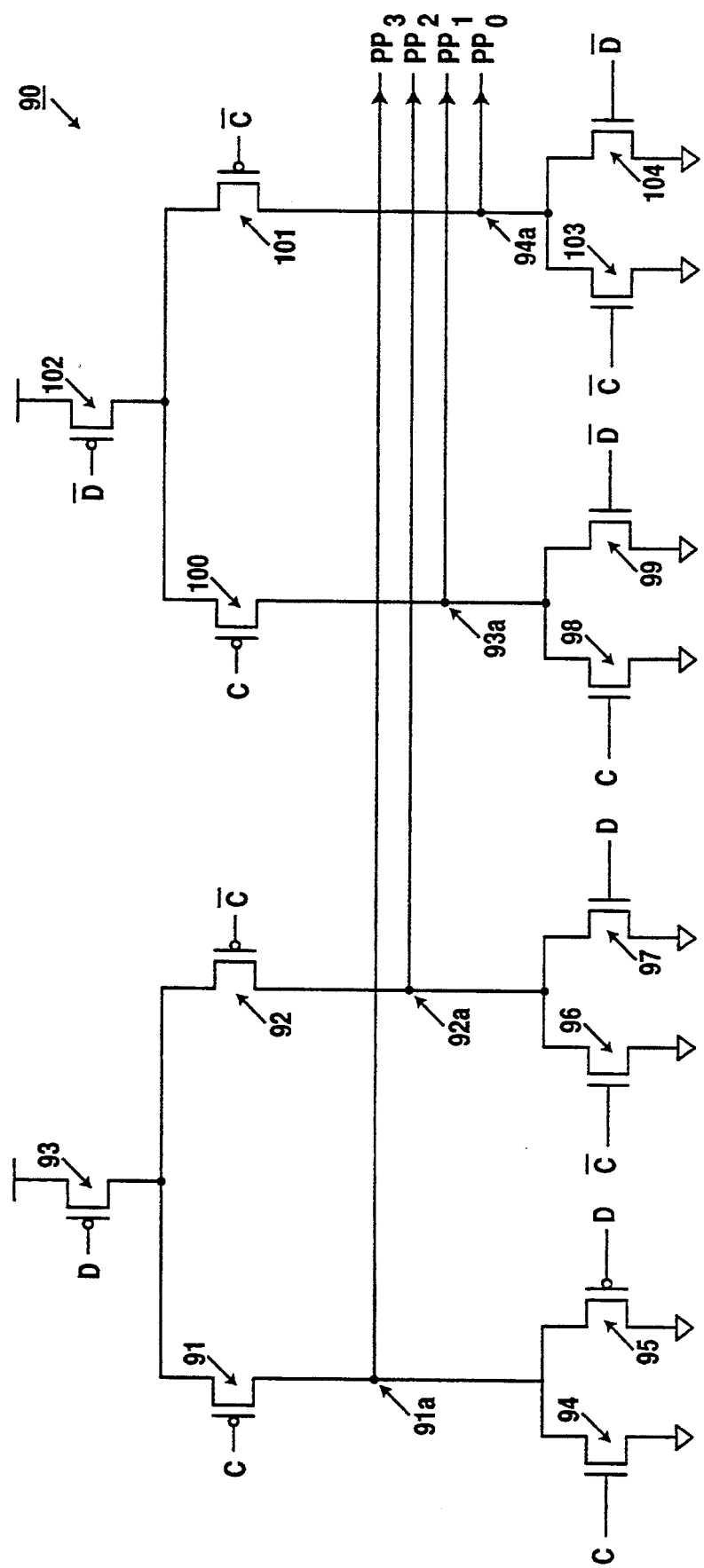
FIG. 6 is a circuit diagram of another prior art circuit that implements the logic function of the decoder circuit of FIG. 2.

FIG. 6 illustrates the circuit of another prior decoder circuit 90 which is a prior improvement of circuit 50 of FIG. 4. Decoder circuit 90 of FIG. 6 also implements the logic function of decoder 20 of FIG. 2. As can be seen from FIG. 6, transistors 91 and 93 through 95 form one NOR gate (i.e., NOR gate 21 of FIG. 2). Transistors 92–93 and 96–97 form another NOR gate (i.e., NOR gate 22 of FIG. 2). Transistor 93 is shared by two NOR gate circuits. Transistors 98 through 100 and 102 form the third NOR gate (i.e., NOR gate 23 of FIG. 2). Transistors 101 through 104 form the fourth NOR gate (i.e., NOR gate 24 of FIG. 2). Transistor 102 is shared by two NOR gate circuits.

Circuit 90 of FIG. 6 reduces the input capacitance for the D input signal. This is done by reducing the number of transistors for each NOR gate circuit. As is shown in FIG. 6, transistor 93 is shared by two NOR gate circuits and transistor 102 is shared by two NOR gate circuits. This is also due to the fact that the C and $\overline{C}$ input signals are complementary signals and cannot be both made logically high or low simultaneously.

Similar to circuit 70 of FIG. 5, circuit 90 of FIG. 6 also suffers from different propagation delays between the C input signal and the D input signal and does not reduce the input capacitance for the C input signal. Therefore, a decoder circuit is required that reduces the input capacitance and has a balanced propagation delay between its input signals.

Figure 7:
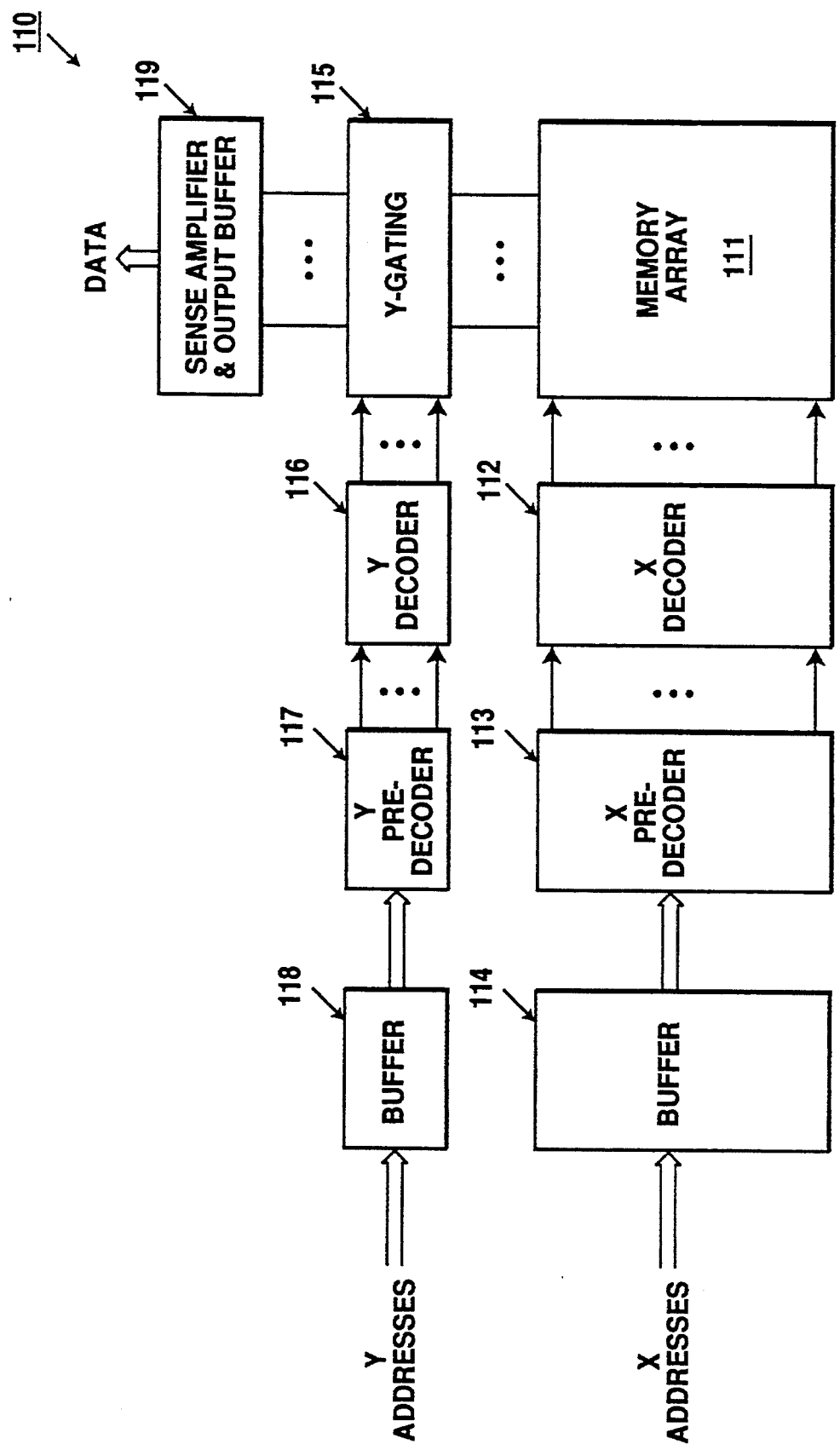
FIG. 7 is a block diagram of a memory circuit that includes an X pre-decoder and a Y pre-decoder, both of which implement an embodiment of the present invention.

FIG. 7 illustrates in block diagram form the circuit of a memory 110 that includes an X pre-decoder 113 and a Y pre-decoder 117 both of which implement an embodiment of the present invention. Referring to FIG. 7, memory 110 includes a memory array 111 that is made up of memory cells that store data at addresses. For one embodiment, memory array 111 stores 512 Kbits ("kilobits") of data. For alternative embodiments, memory array 111 can be smaller or larger.

For one embodiment, memory 110 is a static random access memory ("SRAM"). For another embodiment, memory 110 is an electrically erasable and programmable read only memory ("EEPROM"). For alternative embodiments, memory 110 can be other types of memories. For example, memory 110 can be a DRAM, RAM, ROM, PROM, or EPROM. For a further embodiment, memory 110 can be any other integrated circuit that employs a decoder or pre-decoder.

Memory 110 further includes an X decoder 112, a Y gating 115, and a Y decoder 116. X decoder 112 is the row decoder and is coupled to the word lines of memory array 111. Y decoder 116 is the column decoder of memory 110. Y decoder 116 is connected to the bit lines of memory array 111 via Y gating 115. Y gating 115 is also connected to a sense amplifier and output buffer 119.

X decoder 112 is also connected to X pre-decoder 113. X pre-decoder 113 receives X addresses from external circuitry (not shown) via a buffer 114. X pre-decoder 113 then pro-decodes each of the X addresses received and applies the pre-decoded X addresses to X decoder 112. X decoder 112 then decodes the pre-decoded X addresses and selects a word line for each X address.

Y decoder 116 is connected to Y pre-decoder 117. Y pre-decoder 117 receives Y addresses from the external circuitry via a buffer 118. Y pre-decoder 117 then pre-decodes each of the Y addresses received and applies the pre-decoded Y addresses to Y decoder 116. Y decoder 116 then selects a byte of bit lines (i.e., eight bit lines) or a word of bit lines (i.e., sixteen bit lines) for each Y address. In alternative embodiments, Y decoder 116 can select any number of bit lines for each Y address.

Figure 8:
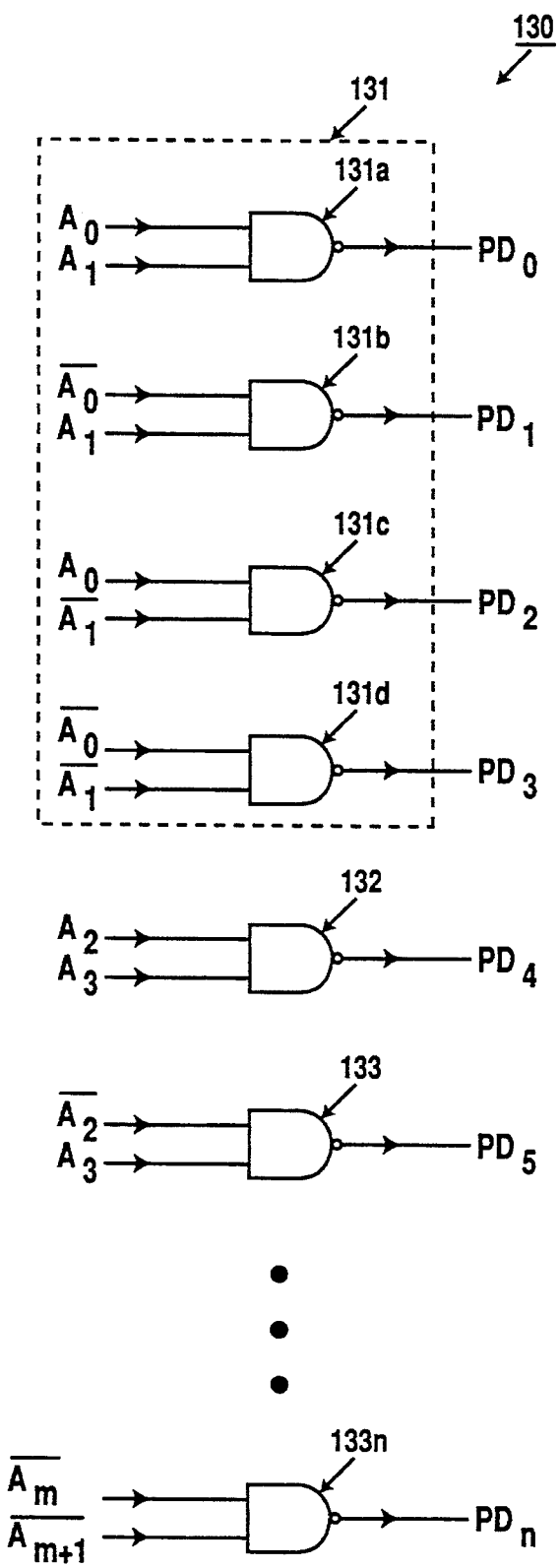
FIG. 8 is a logic diagram of one of the pre-decoders of FIG. 7 that is implemented in the NAND configuration.

Referring now to FIG. 8, a pre-decoder 130 is shown in block diagram form. Pre-decoder 130 can be used as X pre-decoder 113 of FIG. 7 or Y pre-decoder 117 of FIG. 7. Pre-decoder 130 is implemented in NAND configuration and includes NAND gates 131a through 133n. Pre-decoder 130 implements an embodiment of the present invention.

As can be seen from FIG. 8, pre-decoder 130 receives a number of $A_o$ through $A_{m+1}$ input signals and their complementary signals $\overline{A_0}$ through $\overline{A_{m+1}}$. Pre-decoder 130 outputs a number of $PD_o$ through $PD_n$ pre-decoded signals. Each NAND gate of pre-decoder 130 receives two input signals. Each four NAND gates of NAND gates 131a–133n receive a combination of two of the $\overline{A_o}$ through $\overline{A_{m+1}}$ For example, NAND gate 131a receives the $A_0$ and $A_1$ input signals. NAND gate 131b receives the $\overline{A_o}$ input signal (i.e., the complementary signal of the $A_0$ input signal) and the $A_1$ input signal. NAND gate 131c receives the $A_0$ input signal and the $\overline{A_1}$ input signal (i.e., the complementary signal of the $A_1$ input signal). NAND gate 131d receives the complementary signals of the $A_0$ and $A_1$ input signals. NAND gates 131a–131d each outputs the respective one of four $PD_0$ through $PD_3$ signals.

NAND gate 132 receive the $A_2$ and $A_3$ input signals and NAND gate 133 receives the $\overline{A_2}$ input signal (i.e., the complementary signal of the $A_2$ signal) and the $A_3$ input signal. Therefore, as can be seen from FIG. 8, pre-decoder 130 is configured such that every four NAND gates of NAND gates 131a through 133n receive two of the $A_0$ through $A_{m+1}$ input signals and their complementary signals. The circuit of pre-decoder 130 is thus illustrated in more detail in part in FIG. 9

(i.e., circuit 131) that only includes NAND gates 131a through 131d to avoid unnecessary repetition and to aid in clarity. As will be described below in conjunction with FIG. 9, the circuit of pre-decoder 130 minimizes the input capacitance and provides the balanced propagation delay for its input signals.

Figure 9:
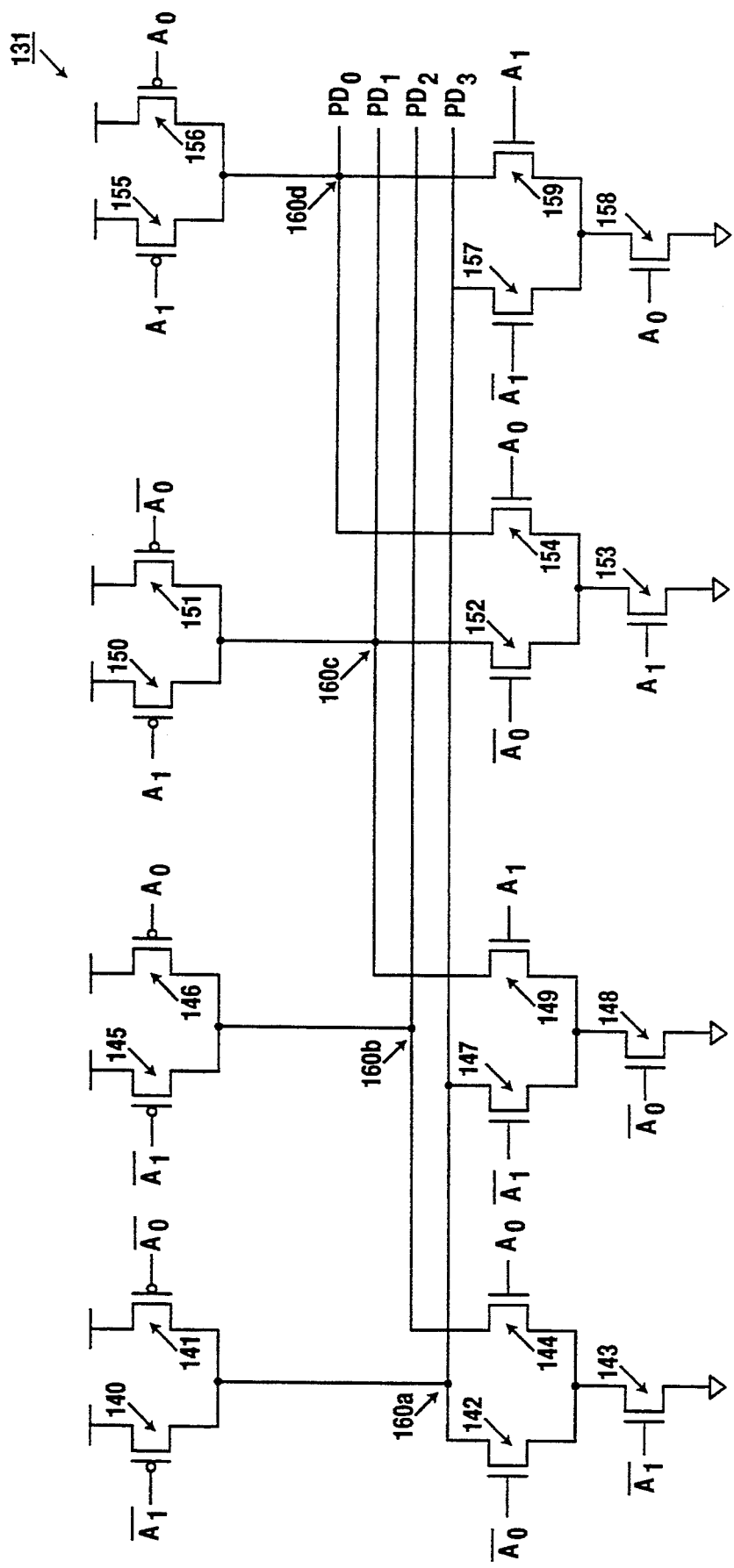
FIG. 9 is a circuit diagram of the predecoder of FIG. 8.

Referring now to FIG. 9, circuit 1 31 includes four P-channel transistor pairs 140–141, 145–146, 150–151, and 155–156. Each of the four P-channel transistor pairs 140–141, 145–146, 150–151, and 155–156 have two P-channel transistors connected in parallel between the power supply and one of four output nodes 160a through 160d. For example, transistors 140–141 have their sources connected to the power supply and their drains connected to output node 160a. Transistors 150–151 have their sources connected to the power supply and drains connected to output node 160c.

Each of transistors 140–141, 145–146, 150–151, and 155–156 receives one of the $A_0$ and $A_1$ input signals and their complementary signals. For example, transistor 156 receives the $A_0$ signal and transistor 155 receives the $A_1$ signal. Transistor 151 receives the $\overline{A_0}$ signal and transistor 150 receives the $A_1$ signal. Transistor 146 receives the $A_0$ signal and transistor 145 receives the $\overline{A_1}$ signal. Transistor 141 receives the $\overline{A_0}$ signal and transistor 140 receives the $\overline{A_1}$ signal.

Circuit 131 also includes N-channel transistors 142–144, 147–149, 152–154, and 157–159. Transistors 142–143 form one N-channel transistor path between output node 160a and ground. Transistors 147–148 form another N-channel transistor path between output node 160a and ground. Transistors 142–143 each receives one of the $\overline{A_0}$ and $\overline{A_1}$ input signals and transistors 147–148 each also receives the $\overline{A_0}$ and $\overline{A_1}$ input signals. The difference between the N-channel transistor path of transistors 142–143 and that of transistors 147–148 is that transistor 142 is the upper transistor in the transistor path of transistors 142–143 that receives the $\overline{A_0}$ input signal while transistor 148 is the lower transistor of transistor path of transistors 147–148 that receives the $\overline{A_0}$ input signal. Output node 160a outputs the $PD_3$ signal. Transistors 140–143 and 147–148 together implement NAND gate 131d of pre-decoder 130 of FIG. 8.

N-channel transistors 143–144 form one N-channel transistor path between output node 160b and ground and transistors 157 and 158 form another N-channel transistor path between output node 160b and ground. Transistor 144 (i.e., the upper transistor in its transistor path) receives the $A_0$ input signal while transistor 158 (i.e., the lower transistor in its transistor path) receives the $A_0$ input signal. The upper transistor 157 in the path receives the $\overline{A_1}$ input signal. Transistors 143–146 and 157–158 together implement NAND gate 131c of pre-decoder 130 of FIG. 8. Output node 160b outputs the $PD_2$ signal.

Likewise, NAND gate 131b of pre-decoder 130 of FIG. 8 is implemented by transistors 148–153 and NAND gate 131a of FIG. 8 is formed by transistors 153–156 and 158–159. Transistors 148–149 form one transistor path between output node 160c and ground and transistors 152–153 form another transistor path between output node 160c and ground. The two transistor paths receive the same input signals with switched order.

As can be seen from FIG. 9, each of transistors 143, 148, 153, and 158 is shared by two NAND gate circuits. Fo example, transistor 148 is shared by the NAND gate formed by transistors 140–143 and 147–148 and the NAND gate formed by transistors 148–153. This reduces the total size of the transistors required within circuit 131, thus reducing the input capacitance of the circuit.

In addition, since each NAND gate circuit of circuit 131 has two N-channel transistor paths receiving the same input signals with switched order, circuit 131 has a balanced propagation delay for all of the input signals of the circuit. For example, in the transistor path formed by transistors 152–153, the upper transistor 152 receives the $\overline{A_0}$ input signal and the lower transistor 153 receives the $A_1$ input signal. In the transistor path of transistors 148–149, the upper transistor 149 receives the $A_1$ input signal while the lower transistor 148 receives the $\overline{A_0}$ input signal. This provides the balanced propagation delay for the $\overline{A_0}$ and $A_1$ input signals.

Figure 10:
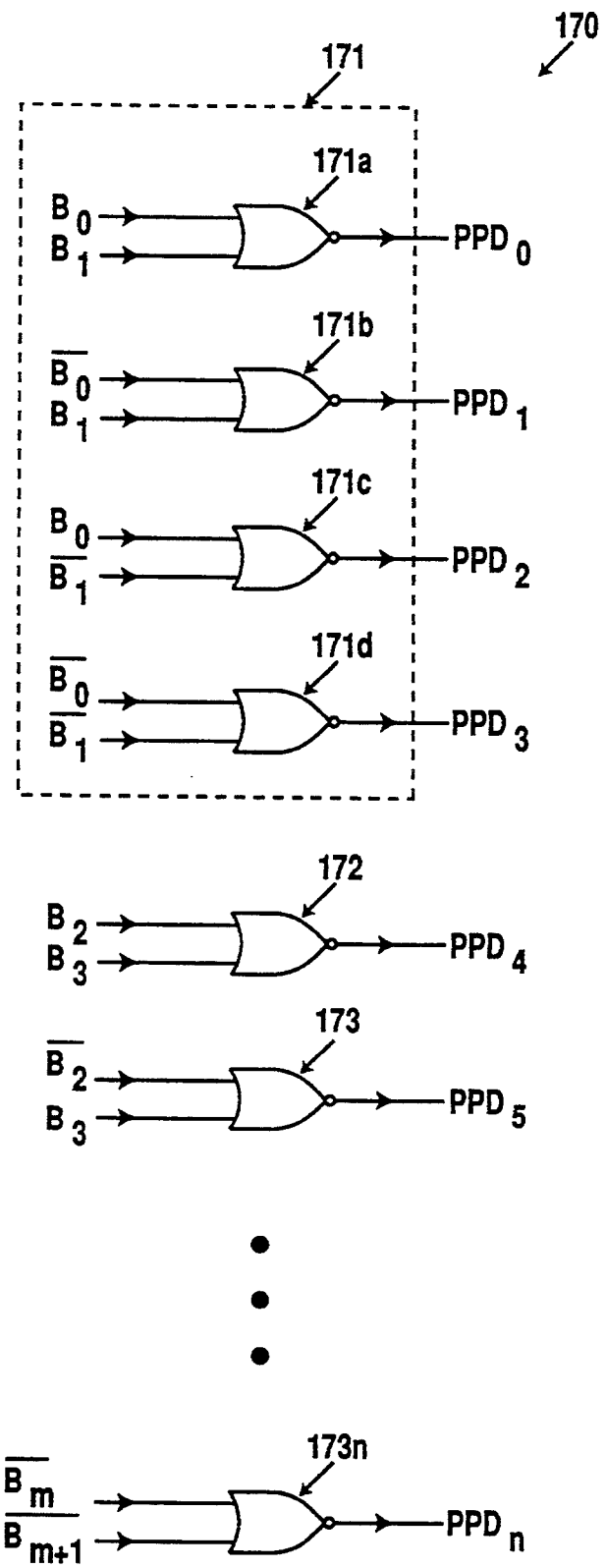
FIG. 10 is a logic diagram of one of the pre-decoders of FIG. 7 that is implemented in the NOR configuration.

Referring now to FIG. 10, a pre-decoder 170 is shown in block diagram form. Similar to pre-decoder 130 of FIG. 8, pre-decoder 170 can also be used as X pre-decoder 113 of FIG. 7 or Y pre-decoder 117 of FIG. 7. Pre-decoder 170 is implemented in NOR configuration and includes NOR gates 171a through 173n. Each of X and Y pre-decoders 113 and 117 of FIG. 7 is implemented by NAND gates when the input signals of the pre-decoder are active high signals. When one of pre-decoders 113 and 117 of FIG. 7 is required to have logically active low input signals, the pre-decoder is implemented in NOR configuration.

Pre-decoder 170 also implements an embodiment of the present invention. In order to avoid repetition and to aid in clarity, only a portion of pre-decoder 170 (i.e., circuit 171) is shown in circuit diagram form in FIG. 11.

Figure 11:
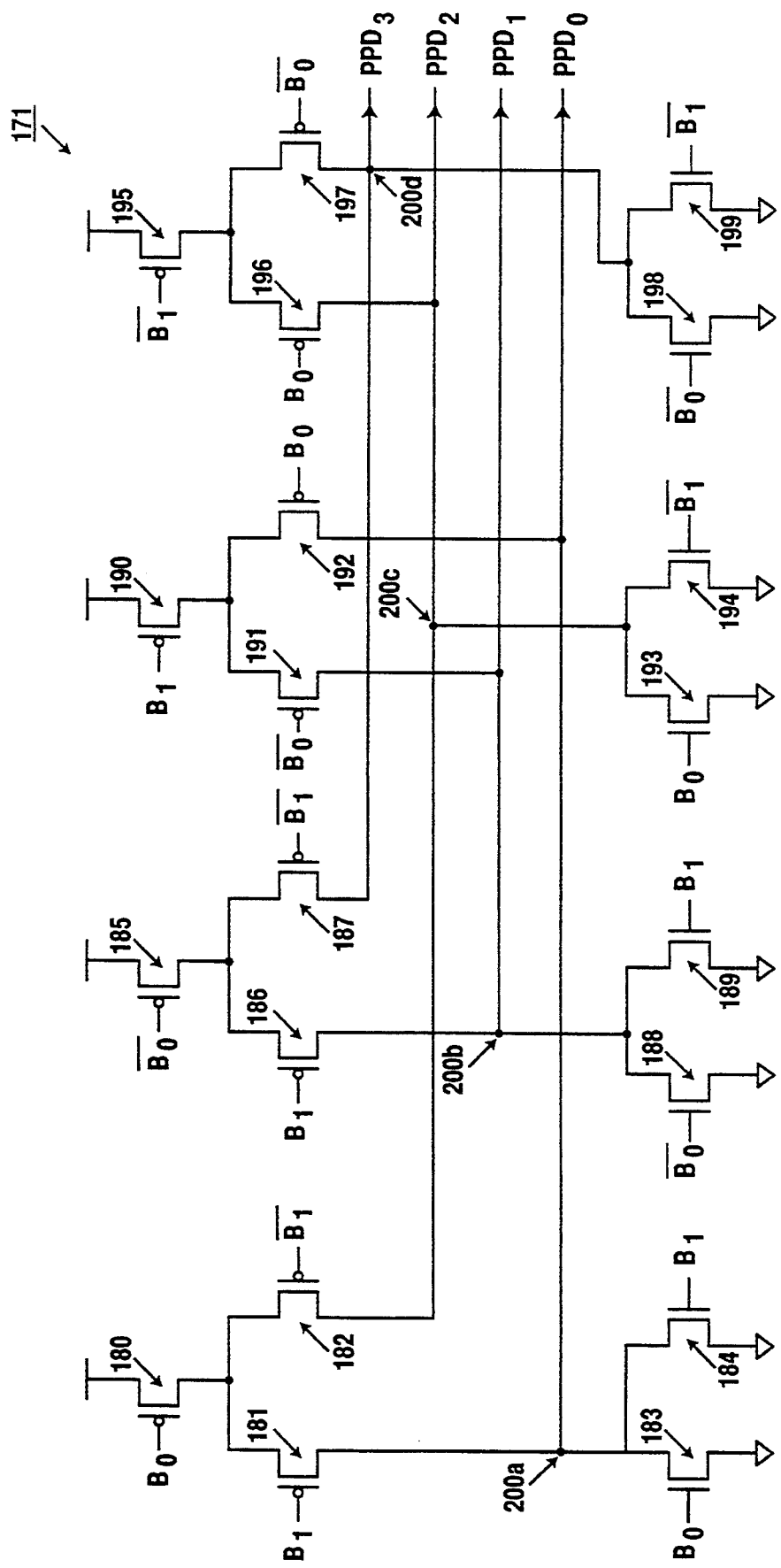
FIG. 11 is a circuit diagram of the pre-decoder of FIG. 10.

As can be seen from FIG. 11, each NOR gate is configured by two P-channel transistor paths with the same input signals. The order of applying the same input signals to each of the two transistor paths is switched such that the balanced propagation delay is obtained for the input signals. For example, the NOR gate formed roy transistors 185–186 and 188–191 has one P-channel transistor path of transistors 185–186 and another P-channel transistor path of transistor 190–191. Transistors 185–186 receive the $\overline{B_0}$ and $B_1$ input signals, respectively, and transistors 190–191 receive the same $\overline{B_0}$ and $B_1$ input signals. The difference is that transistor 185 which is the upper transistor in the path formed by transistors 185–186 receives the $\overline{B_0}$ input signal while transistor 191 which is the lower transistor in the path formed by transistors 190–191 receives the $\overline{B_0}$ input signal. This allows circuit 171 to provide balanced propagation delay for the $\overline{B_0}$ and $B_1$ input signals.

Moreover, since each of transistors 180, 185, 190, and 195 is shared by two NOR gate circuits, the input capacitance of circuit 170 is also reduced as the total size of the transistors required within circuit 171 is reduced.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A logic circuit implementing a logic NAND function with respect to a first input signal and a second input signal, comprising:

(A) a pull up network coupled to a power supply and an output node;

(B) a first circuit branch having a first transistor and a second transistor, wherein the first transistor has a first end coupled to the output node and a second end coupled to a first end of the second transistor, wherein the second transistor has a second end coupled to ground, wherein the first transistor receives the first input signal at a control input and the second transistor receives the second input signal at a control input;

(C) a second circuit branch having a third transistor and a fourth transistor, wherein the third transistor has a first end coupled to the output node and a second end coupled to a first end of the fourth transistor, wherein the fourth transistor has a second end coupled to ground, wherein the third transistor receives the second input signal at a control input and the fourth transistor receives the first input signal at a control input such that the logic circuit has a balanced propagation delay with respect to the first and second input signals.

2. The logic circuit of claim 1, wherein the pull up network includes a first pull up transistor and a second pull up transistor, wherein the first pull up transistor receives the first input signal and the second pull up transistor receives the second input signal.

3. The logic circuit of claim 1, wherein the transistors are metal-oxide semiconductor field effect transistors (MOSFET).

4. The logic circuit of claim 1, wherein the first and second circuit branches cause the logic circuit to have an increased load driving ability, wherein the first and second circuit branches also cause the logic circuit to have a minimized and balanced propagation delay with respect to the first and second input signals.

5. The logic circuit of claim 1, wherein the first end of the transistors is a drain and the second end of the transistors is a source, wherein the control input of the transistors is a gate.

6. The logic circuit of claim 1, wherein the first pull up element includes a first P-channel transistor and the second pull up element includes a second P-channel transistor, wherein each of the first and second P-channel transistors has a source coupled to the power supply and a drain coupled to the output node, wherein the first P-channel transistor has a gate coupled to receive the first input signal, wherein the second P-channel transistor has a gate coupled to receive the second input signal.

7. A decoder circuit for a semiconductor circuit, comprising:

(A) a pull up network circuit coupled to a power supply and a respective one of a first, a second, a third, and a fourth output node;

(B) a transistor network circuit coupled to the first, second, third, and fourth output nodes and a ground, wherein the transistor network circuit further comprises (i) a first transistor circuit branch having a first, a second, and a third transistor, wherein the first transistor has a first end coupled to the ground, a second end coupled to a first end of the second and third transistors, wherein the second transistor has a second end coupled to the first output node, wherein the third transistor has a second end coupled to the second output node, wherein the first transistor receives the second input signal at a control input, wherein the second transistor receives the first input signal at a control input, wherein the third transistor receives the complementary signal of the first input signal at a control input;

(ii) a second transistor circuit branch having a fourth, a fifth, and a sixth transistor, wherein the fourth transistor has a first end coupled to the ground, a second end coupled to a first end of the fifth and sixth transistors, wherein the fifth transistor has a second end coupled to the first output node, wherein the sixth transistor has a second end coupled to the third output node, wherein the fourth transistor receives the first input signal at a control input, wherein the fifth transistor receives the second input signal at a control input, wherein the sixth transistor receives the complementary signal of the second input signal at a control input;

(iii) a third transistor circuit branch having a seventh, an eighth, and a ninth transistor, wherein the seventh transistor has a first end coupled to the ground, a second end coupled to a first end of the eighth and ninth transistors, wherein the eighth transistor has a second end coupled to the third output node, wherein the ninth transistor has a second end coupled to the fourth output node, wherein the seventh transistor receives the complementary signal of the second input signal at a control input, wherein the eighth transistor receives the first input signal at a control input, wherein the ninth transistor receives the complementary signal of the first input signal at a control input;

(iv) a fourth transistor circuit branch having a tenth, an eleventh, and a twelfth transistor, wherein the tenth transistor has a first end coupled to the ground, a second end coupled to a first end of the eleventh and twelfth transistors, wherein the eleventh transistor has a second end coupled to the second output node, wherein the twelfth transistor has a second end coupled to the fourth output node, wherein the tenth transistor receives the complementary signal of the first input signal at a control input, wherein the eleventh transistor receives the second input signal at a control input, wherein the twelfth transistor receives the complementary signal of the second input signal at a control input, wherein the decoder circuit has a balanced propagation delay with respect to the first and second input signals and a minimized input capacitance.

8. The decoder circuit of claim 7, wherein the pull up network circuit further comprises a first pair, a second pair, a third pair, and a fourth pair of pull up elements, wherein the first pair of pull up elements receive a first input signal and a second input signal, wherein the second pair of pull up elements receive (1) a complementary signal of the first input signal and (2) the second input signal, wherein the third pair of pull up elements receive (1) the first input signal and (2) a complementary signal of the second input signal, wherein the fourth pair of pull up elements receive complementary signals of the first and second input signals.

9. The decoder circuit of claim 7, wherein the transistor network circuit causes the decoder circuit to have an increased load driving ability, wherein the transistor network circuit causes the decoder circuit to have a minimized and balanced propagation delay with respect to the first and second input signals with a minimized total transistor size.

10. The decoder circuit of claim 7, wherein the first end of the transistors is a drain and the second end of the transistors is a source, wherein the control input of the transistors is a gate.

11. The decoder circuit of claim 7, wherein the transistors are metal-oxide semiconductor field effect transistors (MOSFET).

12. A logic circuit implementing a logic NOR function with respect to a first input signal and a second input signal, comprising:
(A) a pull down network coupled to a ground and an output node;
(B) a first circuit branch having a first transistor and a second transistor, wherein the first transistor has a first end coupled to the output node and a second end coupled to a first end of the second transistor, wherein the second transistor has a second end coupled to a power supply, wherein the first transistor receives the first input signal at a control input and the second transistor receives the second input signal at a control input;
(C) a second circuit branch having a third transistor and a fourth transistor, wherein the third transistor has a first end coupled to the output node and a second end coupled to a first end of the fourth transistor, wherein the fourth transistor has a second end coupled to the power supply, wherein the third transistor receives the second input signal at a control input and the fourth transistor receives the first input signal at a control input such that the logic circuit has a balanced propagation delay with respect to the first and second input signals.

13. The logic circuit of claim 12, wherein the pull down network further comprises a first pull down transistor end a second pull down transistor, wherein the first pull down transistor receives the first input signal and the second pull down transistor receives the second input signal.

14. The logic circuit of claim 13, wherein the transistors are metal-oxide semiconductor field effect transistors (MOSFET).

15. The logic circuit of claim 12, wherein the first and second circuit branches cause the logic circuit to have an increased load driving ability, wherein the first and second circuit branches also cause the logic circuit to have a minimized and balanced propagation delay with respect to the first and second input signals.

16. The logic circuit of claim 12, wherein the first end of the transistors is a drain and the second end of the transistors is a source, wherein the control input of the transistors is a gate.

17. The logic circuit of claim 13, wherein the first pull down transistor includes a first N-channel transistor and the second pull down transistor includes a second N-channel transistor, wherein each of the first and second N-channel transistors has a source coupled to the ground and a drain coupled to the output node, wherein the first N-channel transistor has a gate coupled to receive the first input signal, wherein the second N-channel transistor has a gate coupled to receive the second input signal.

18. A decoder circuit for a semiconductor circuit, comprising:
(A) a pull down network circuit coupled to a ground and a respective one of a first, a second, a third, arid a fourth output node;
(B) a transistor network circuit coupled to the first, second, third, and fourth output nodes and a power supply, wherein the transistor network circuit further comprises
(i) a first transistor circuit branch having a first, a second, and a third transistor, wherein the first transistor has a first end coupled to the power supply, a second end coupled to a first end of the second and third transistors, wherein the second transistor has a second end coupled to the first output node, wherein third transistor has a second end coupled to the second output node, wherein the first transistor receives the second input signal at a control input, wherein the second transistor receives the first input signal at a control input, wherein the third transistor receives the complementary signal of the first input signal at a control input;
(ii) a second transistor circuit branch having a fourth, a fifth, and a sixth transistor, wherein the fourth transistor has a first end coupled to the power supply, a second end coupled to a first end of the fifth and sixth transistors, wherein the fifth transistor has a second end coupled to the first output node, wherein the sixth transistor has a second end coupled to the third output node, wherein the fourth transistor receives the first input signal at a control input, wherein the fifth transistor receives the second input signal at a control input, wherein the sixth transistor receives the complementary signal of the second input signal at a control input;
(iii) a third transistor circuit branch having a seventh, an eighth, and a ninth transistor, wherein the seventh transistor has a first end coupled to the power supply, a second end coupled to a first end of the eighth and ninth transistors, wherein the eighth transistor has a second end coupled to the third output node, wherein the ninth transistor has a second end coupled to the fourth output node, wherein the seventh transistor receives the complementary signal of the second input signal at a control input, wherein the eighth transistor receives the first input signal at a control input, wherein the ninth transistor receives the complementary signal of the first input signal at a control input;
(iv) a fourth transistor circuit branch having a tenth, an eleventh, and a twelfth transistor, wherein the tenth transistor has a first end coupled to the power supply, a second end coupled to a first end of the eleventh and twelfth transistors, wherein the eleventh transistor has a second end coupled to the second output node, wherein the twelfth transistor has a second end coupled to the fourth output node, wherein the tenth transistor receives the complementary signal of the first input signal at a control input, wherein the eleventh transistor receives the second input signal at a control input, wherein the twelfth transistor receives the complementary signal of the second input signal at a control input, wherein the decoder circuit has a balanced propagation delay with respect to the first and second input signals and a minimized input capacitance.

19. The decoder circuit of claim 18, wherein the pull down network circuit further comprises a first pair, a second pair, a third pair, and a fourth pair of pull down elements, wherein the first pair of pull down elements receive a first input signal and a second input signal, wherein the second pair of pull down elements receive (1) a complementary signal of the first input signal and (2) the second input signal, wherein the third pair of pull down elements receive (1) the first input signal and (2) a complementary signal of the second input signal, wherein the fourth pair of pull down elements receive complementary signals of the first and second input signals.

20. The decoder circuit of claim 18, wherein the transistor network circuit causes the decoder circuit to have an increased load driving ability, wherein the transistor network circuit causes the decoder circuit to have a minimized and balanced propagation delay with respect to the first and second input signals with a minimized total transistor size.

21. The decoder circuit of claim 18, wherein the first end of the transistors is a drain and the second end of the transistors is a source, wherein the control input of the transistors is a gate.

22. The decoder circuit of claim 18, wherein the transistors are metal-oxide semiconductor field effect transistors (MOSFET).

* * * * *